(12) United States Patent (10) Patent No.: US 12,628,535 B2
Jia et al. (45) Date of Patent: May 12, 2026

(54) DISPLAY PANEL AND DISPLAY DEVICE

(71) Applicants: Hefei BOE Joint Technology Co., Ltd., Anhui (CN); BOE Technology Group Co., Ltd., Beijing (CN)

(72) Inventors: Wenbin Jia, Beijing (CN); Xiang Wan, Beijing (CN); Feifei Zhu, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 414 days.

(21) Appl. No.: 18/265,963

(22) PCT Filed: Jul. 29, 2022

(86) PCT No.: PCT/CN2022/109172

§ 371 (c)(1),
(2) Date: Jun. 7, 2023

(87) PCT Pub. No.: WO2024/021092

PCT Pub. Date: Feb. 1, 2024

(65) Prior Publication Data

US 2024/0373726 A1 Nov. 7, 2024

(51) Int. Cl.
*H10K 59/80* (2023.01)
(52) U.S. Cl.
CPC ......... *H10K 59/879* (2023.02); *H10K 59/873* (2023.02)
(58) Field of Classification Search
CPC ........................... H10K 59/879; H10K 59/873
See application file for complete search history.

(56) References Cited

U.S. PATENT DOCUMENTS 8,446,093 B2 5/2013 Kim et al.
2021/0135166 A1* 5/2021 Baek ...................... G06F 3/0412
(Continued)

FOREIGN PATENT DOCUMENTS

CN 107039598 A 8/2017
CN 111175982 A 5/2020
CN 111613628 A 9/2020
(Continued)

OTHER PUBLICATIONS

PCT/CN2022/109172 international search report.
PCT/CN2022/109172 Written Opinion.

*Primary Examiner* — Anne M Hines
(74) *Attorney, Agent, or Firm* — IPro, PLLC

(57) ABSTRACT

Provided are a display panel and a display device. The display panel includes a substrate; sub-pixels on a side of the substrate, where the sub-pixels include light-emitting layers respectively, and each of at least one light-emitting layer includes an internal region and an edge region surrounding the internal region; and a first structure layer, on a light-emitting side of the light-emitting layers, and including lens sets each including microlenses, where the lens sets correspond to the sub-pixels one by one. The lens set includes a first region corresponding to the internal region and a second region corresponding to the edge region, and a density of microlenses in the second region is smaller than a density of mircolenses in the first region. According to the present disclosure, a display effect is improved.

14 Claims, 5 Drawing Sheets

(56) References Cited

U.S. PATENT DOCUMENTS

| | | | |
|---|---|---|---|
| 2021/0384473 A1 | 12/2021 | Zhang et al. | |
| 2022/0308349 A1 | 9/2022 | Yan et al. | |

FOREIGN PATENT DOCUMENTS

| | | | |
|---|---|---|---|
| CN | 112783363 A | 5/2021 |
| CN | 114141969 A | 3/2022 |
| GB | 2564588 A | 1/2019 |
| JP | 2011216414 A | 10/2011 |
| KR | 20170005248 A | 1/2017 |

* cited by examiner

DISPLAY PANEL AND DISPLAY DEVICE

CROSS-REFERENCE TO RELATED APPLICATIONS

This application is a national stage of international PCT Application No. PCT/CN2022/109172 filed on Jul. 29, 2022, the entire contents of which are incorporated herein by reference.

TECHNICAL FIELD

The present disclosure relates to a technical field of display, and in particular, to a display panel and a display device.

BACKGROUND

With the development of technology, display technology has attracted more and more attention. At present, the display panel has a problem of poor display effect.

SUMMARY

Purposes for the present disclosure is to provide a display panel and a display device so as to improve the display effect.

According to an aspect of the present disclosure, a display panel is provided, including:

a substrate;

sub-pixels, on a side of the substrate, the sub-pixels including light-emitting layers respectively, and for at least one of the light-emitting layers, each of the at least one of the light-emitting layers including an internal region and an edge region surrounding the internal region; and a first structure layer, on a light-emitting side of the light-emitting layer and including lens sets, one of the lens sets including microlenses, the lens sets corresponding to the sub-pixels one by one, and the one of the lens sets including a first region corresponding to the internal region and a second region corresponding to the edge region, wherein a density of microlenses in the second region is smaller than a density of microlenses in the first region.

Further, from a center of the one of the lens sets to an edge of the one of the lens sets, a density of one of the microlenses decreases gradually.

Further, a distance between two adjacent microlenses in the second region is greater than a distance between two adjacent microlenses in the first region.

Further, from a center of the one of lens sets to an edge of the one of lens sets, a distance between two adjacent microlenses increases gradually.

Further, a distance between two adjacent microlenses is less than a diameter of each of the microlenses.

Further, one of the microlens is a convex lens structure, a ratio of a rise of one of the microlenses in the second region to the diameter of the one of the microlenses in the second region is smaller than a ratio of a rise of another of the microlenses in the first region to a diameter of the another of the microlensed in the first region.

Further, the ratio of the rise of the one of the microlenses in the second region to the diameter of the one of the microlenses in the second region is greater than or equal to 0.1 or less than or equal to 0.3.

Further, wherein the ratio of the another of the microlenses in the first region the rise to the diameter of the another of the microlenses in the first region is greater than or equal to 0.4 or less than or equal to 0.7.

Further, a diameter of one of the microlenses in the second region is the same as a diameter of another of the microlenses in the first region.

Further, from a center of the one of the lens sets to an edge of the one of the lens sets, a ratio of a rise to a diameter decreases gradually.

Further, a width of the edge region is greater than or equal to 5 μm or less than or equal to 10 μm.

Further, the display panel further including:

an encapsulation structure, covering the sub-pixels, wherein the first structure layer is on a side of the encapsulation structure away the substrate.

Further, the encapsulation structure includes:

a first inorganic encapsulation layer, covering the sub-pixels;

an organic encapsulation layer, on the first inorganic encapsulation layer; and a second inorganic encapsulation layer, covering the organic encapsulation layer, wherein the microlens is on a surface of the second inorganic encapsulation layer away the substrate, and a refractive of each of the microlenses is same as a refractive index of the second inorganic encapsulation layer.

Further, the display panel further including:

a planarization layer, covering the first structure layer, and a refractive index of the planarization layer is less than a refractive index of each of the microlenses.

According to an aspect of the present disclosure, a display device is provided, where the display device includes the display panel.

According to a display panel and a display device of the present disclosure, a light-emitting layer includes an internal region and an edge region surrounding the internal region, an lens set includes a first region corresponding to the internal region and a second region corresponding to the edge region, as a density of a microlens in the second region is smaller than a density of a mircolens in the first region, a light extraction effect of the edge region of the light-emitting layer is weaker than a light extraction effect of the internal region of the light-emitting layer, a problem of the light leakage at the edge region of the light-emitting layer can be improved, a problem of cross-color due to the light leakage at the edge region of the light-emitting layer can be avoided, and thus a display effect can be improved.

Figure 1:
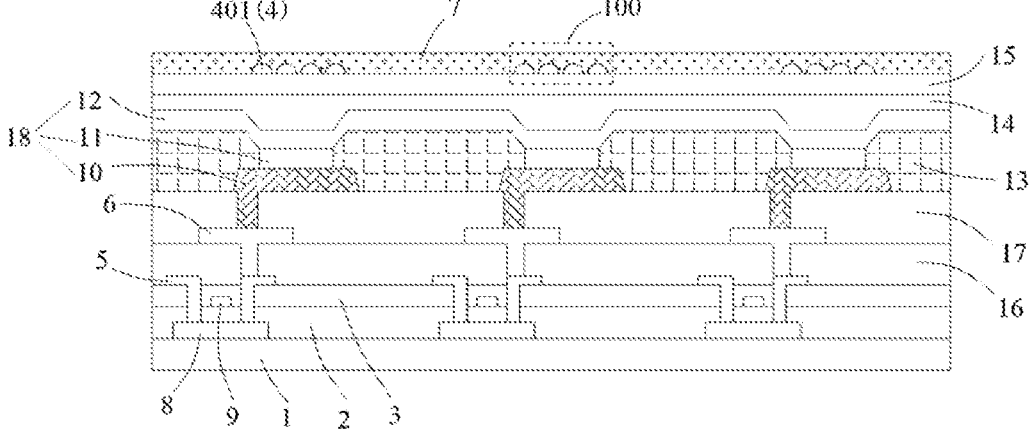
FIG. 1 is a schematic diagram illustrating a display panel according to embodiments of the present disclosure.

Description of reference numerals: 1—substrate: 2—gate insulation layer: 3—interlayer insulation layer: 4—first structure layer: 401—microlens: 5—first source/drain electrode layer: 6—second source/drain electrode layer: 7—planarization layer: 8—active layer: 9—gate electrode layer: 10—first electrode: 11—light-emitting layer: 12—second electrode: 13—pixel definition layer: 14—encapsulation structure: 15—base: 16—first planarization layer: 17—second planarization layer: 18—sub-pixel: 100—lens set: 200—internal region: 300—edge region: 400—first region: 500—second region.

DETAILED DESCRIPTION

Exemplary embodiments will be described herein in detail, examples of which are represented in the accompanying drawings. When the following descriptions involve the drawings, like numerals in different drawings refer to like or similar elements unless otherwise indicated. The embodiments described in the following exemplary embodiments do not represent all embodiments consistent with the present application. Rather, they are only examples of devices and methods that are consistent with some aspects of the present application, as detailed in the appended claims.

The terms used in the present disclosure are for the purpose of describing specific embodiments only and are not intended to limit the present disclosure. Unless otherwise defined, technical terms or scientific terms used in the present disclosure shall have their ordinary meanings as understood by those of ordinary skills in the field to which the present disclosure belongs. The "first", "second" and similar words used in the specification and claims of the present disclosure do not indicate any order, quantity or importance, but are only used to distinguish different components. Similarly, similar words such as "a" or "an" do not mean quantity limitation, but mean that there is at least one. "Multiple" or "a plurality of" means two or more. Unless otherwise specified, similar words such as "front", "rear", "lower" and/or "upper" are only for convenience of explanation, and are not limited to a position or a spatial orientation. Similar words such as "include" or "comprise" mean that the elements or objects appear before "include" or "comprise" cover the elements or objects listed after "include" or "comprise" and their equivalents, but do not exclude other elements or objects. Similar words such as "connect" or "couple" are not limited to physical or mechanical connection, but may include electrical connection, whether direct or indirect. Singular forms "a", "the" and "said" used in the specification of the present disclosure and the appended claims are also intended to include plural forms, unless the context clearly indicates other meaning. It should also be understood that the term "and/or" as used herein refers to and includes any or all possible combinations of one or more associated listed items.

Figure 8:
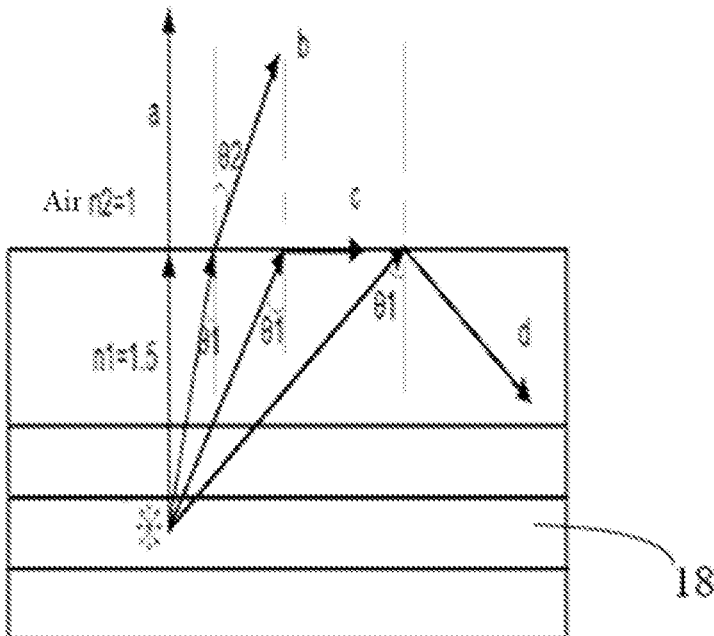
FIGS. 8 and 9 are schematic diagrams illustrating a light-emitting principle in the related arts.
Figure 9:
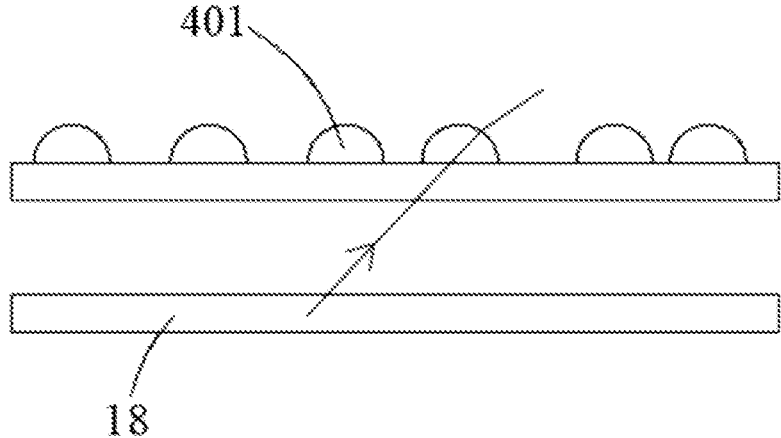

In the related arts, as shown in FIG. 8, the display panel includes the plurality of sub pixels 18. When the light emitted by the sub pixels 18 reaches an interface between the display panel and external air, if an incident angle is too large, it is easy to cause a total internal reflection and reduce a light-emitting efficiency. As shown in FIG. 9, a microlens 401 is on a light-emitting side of sub pixel 18. A refractive index of the microlens 401 is greater than a refractive index of the external air. When the incident angle is too large, the total internal reflection can be reduced and the light-emitting efficiency can be improved. Reducing the total internal reflection of the light is equivalent to increasing a light-emitting angle of the light, such that the light emitted from an edge of the sub-pixel 18 can easily affect the light emitted from the adjacent sub-pixels 18, which is easily to produce cross-color.

Figure 2:
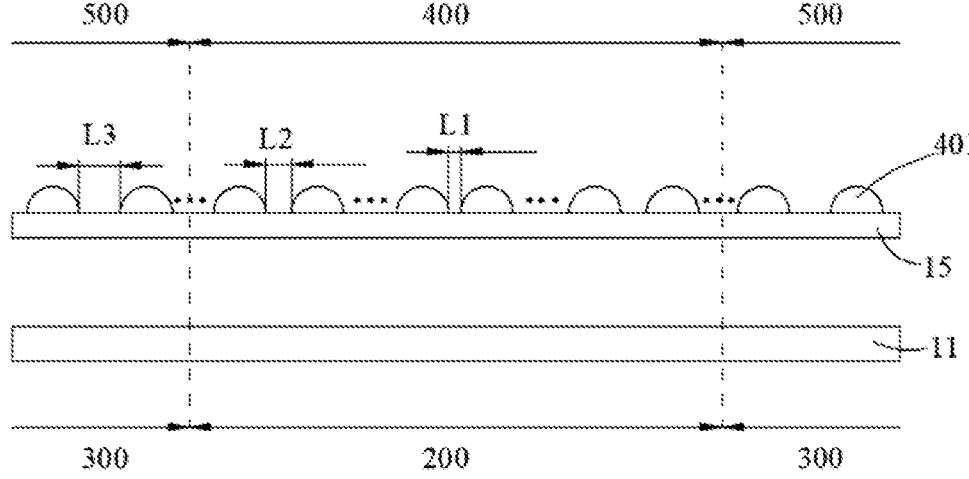
FIG. 2 is a schematic diagram illustrating a first structure layer and a light-emitting layer of a display panel according to embodiments of the present disclosure.

According to an embodiments of the present disclosure, a display panel is provided. As shown in FIGS. 1 and 2, the display panel includes a substrate 1, sub-pixels 18 and a first structure layer 4.

A quantity of the sub-pixels 18 is more than one, and the sub-pixels 18 are on a side of the substrate 1. The sub-pixel 18 includes a light-emitting layer 11. At least one light-emitting layer 11 includes an internal region 200 and an edge region 300 surrounding the internal region 200. The first structure layer 4 is on a light-emitting side of the light-emitting layer 11 and includes lens sets 100. Each of the lens set 100 may include microlenses 401. The lens sets 100 correspond to the plurality of sub-pixels 18 one by one. The lens set 100 includes a first region 400 corresponding to the internal region 200 and a second region 500 corresponding to the edge region 300. A density of the microlenses 401 in the second region 500 is smaller than a density of the microlenses 401 in the first region 400.

According to a display panel of the embodiments of the present disclosure, the light-emitting layer 11 includes the internal region 200 and the edge region 300 surrounding the internal region 200, the lens set 100 includes the first region 400 corresponding to the internal region 200 and the second region 500 corresponding to the edge region 300, since a density of the microlenses 401 in the second region 500 is smaller than a density of the mircolenses 401 in the first region 400, a light extraction effect of the edge region 300 of the light-emitting layer 11 is weaker than a light extraction effect of the internal region 200 of the light-emitting layer 11, such that the light leakage at the edge of the light-emitting layer 11 can be alleviated, and cross-color due to the light leakage at the edge of the light-emitting layer 11 can be avoided, and thus a display effect can be improved.

Various parts of the display panel in the embodiments of the present disclosure will be described below.

As shown in FIG. 1, the substrate 1 may be a rigid substrate. The rigid substrate may be a glass substrate, a Polymethyl methacrylate (PMMA) substrate, etc. Certainly, the substrate 1 may also be a flexible substrate, which may be a Polyethylene terephthalate (PET) substrate, a Polyethylene naphthalate two formic acid glycol ester (PEN) substrate, or a Polyimide (PI) substrate.

As shown in FIG. 1, according to the present disclosure, the display panel further includes an active layer 8, a gate insulation layer 2, a gate electrode layer 9, an interlayer insulation layer 3 and a first source/drain electrode layer 5. The active layer 8 may be on the substrate 1. The gate insulation layer 2 may be on the substrate 1 and cover the active layer 8. The gate electrode layer 9 may be on a side of the gate insulation layer 2 away from the substrate 1. The interlayer insulation layer 3 may be located on the gate insulation layer 2 and cover the gate electrode layer 9. The first source/drain electrode layer 5 may be on the interlayer insulation layer 3, and a portion of a pattern for the first source/drain electrode layer 5 may be connected to the active layer 8 through a via penetrated through the interlayer insulation layer 3 and the gate insulation layer 2.

As shown in FIG. 1, the display panel of the present disclosure may further include a first planarization layer 16 and a second source/drain electrode layer 6. The first planarization layer 16 covers the first source/drain electrode layer 5 and the interlayer insulation layer 3. The second source/drain electrode layer 6 may be on the first planarization layer 16, and a portion of a pattern for the second source/drain electrode layer 6 may be electrically connected to the above-mentioned first source/drain electrode layer 5 via an via protruded through the first planarization layer 16. The display panel of the present disclosure may further include a second planarization layer 17. The second planarization layer 17 may cover the second source/drain electrode layer 6. According to an embodiment of the present disclosure, the display panel may include a pixel circuit. The active layer 8, the gate insulation layer 2, the gate electrode layer 9, the interlayer insulation layer 3, and the first source drain electrode layer 5 described above may form a driver transistor.

As shown in FIG. 1, the sub-pixels 18 may include red sub-pixels, green sub-pixels, and blue sub-pixels. Respective sub-pixels 18 may include a first electrode 10, a light-emitting layer 11, and a second electrode 12 which are laminated one after another. The light-emitting layer 11 may be organic electroluminescent layer or a quantum dot light-emitting layer, which is not specifically limited by the embodiments of the present disclosure. The first electrode 10 may be the anode, the second electrode 12 may be the cathode, but the present disclosure is not limited to this. As shown in FIG. 2, the light-emitting layer 11 may include an internal region 200 and an edge region 300 around the internal region 200. When the light-emitting layer 11 is a rectangular shape, the edge region 300 may be a rectangular ring. The ratio of a width of the edge region 300 to a length or a width of the light-emitting layer 11 may be ⅒-⅓. It should to be noted that the edge region 300 has uniform widths along an extension direction of the edge region 300, that is, a width of the edge region 300 in a direction along the length of the light-emitting layer 11 is the same as a width of the edge region 300 in a direction along the width of the light-emitting layer 11. Specifically, the width F of the edge region 300 may be greater than or equal to 5 μm or less than or equal to 10 μm, and further, the width F of the edge region 300 may be greater than or equal to 5 μm and less than or equal to 10 μm, such as 5 μm, 7 μm, 8 μm, 9 μm, 10 μm, etc.

As shown in FIG. 1, the display panel of the present disclosure may further include a pixel definition layer 13. The pixel definition layer 13 may be on a side of the second planarization layer 17 away the substrate 1 and includes a plurality of pixel openings. The first electrode 10 may be within the pixel opening, the light-emitting layer 11 may be on a side of the first electrode 10 away the substrate 1, and the second electrode 12 may be on a side of the light-emitting layer 11 away the substrate 1. The first electrode 10 is electrically connected to the second source/drain electrode layer 6 through a via penetrated through the second planarization layer 17. A plurality of the sub-pixels 18 may share one second electrode 12. The display panel of the present disclosure may further include an encapsulation structure 14. The encapsulation structure 14 may cover the sub-pixels 18. The encapsulation structure 14 may include a first inorganic encapsulation layer, an organic encapsulation layer, and a second inorganic encapsulation layer which are laminated one after another. The second inorganic encapsulation layer is on a side of the first inorganic encapsulation layer away the substrate.

As shown in FIG. 1, the first structure layer 4 is at the light-emitting side of the light-emitting layer 11. The light-emitting side of the light-emitting layer 11 may be a side of the light-emitting layer 11 away the substrate 1. The first structure layer 4 may be at the side of the encapsulation structure 14 away the substrate 1. For example, the microlens 401 may be on a surface of the second inorganic encapsulation layer away the substrate 1. A refractive index of the microlens 401 may be the same or substantially the same as a refractive index of the second inorganic encapsulation layer, or, of course, may be different. The refractive index of the microlens 401 is the same or substantially the same as the refractive index of the second inorganic encapsulation layer, i.e., the refractive index of the microlens 401 and the refractive index of the second inorganic encapsulation layer are equal to a predetermined value within an error tolerance, which may be ±5%. In other embodiments of the present disclosure, the microlens 401 may be provided on a base 15, which is on the surface of the encapsulation structure 14 away the substrate 1. The material of the base 15 may be glass, etc. The first structure layer 4 may include microlenses 401. The microlens 401 may be convex lens structure, but the present disclosure is not limited thereto. The microlenses 401 may form lens sets 100. Respective lens sets 100 may include a plurality of the microlenses 401. The lens sets 100 correspond to the sub-pixels 18 one by one. In addition, the materials of the microlenses 401 may include photoresist.

Figure 3:
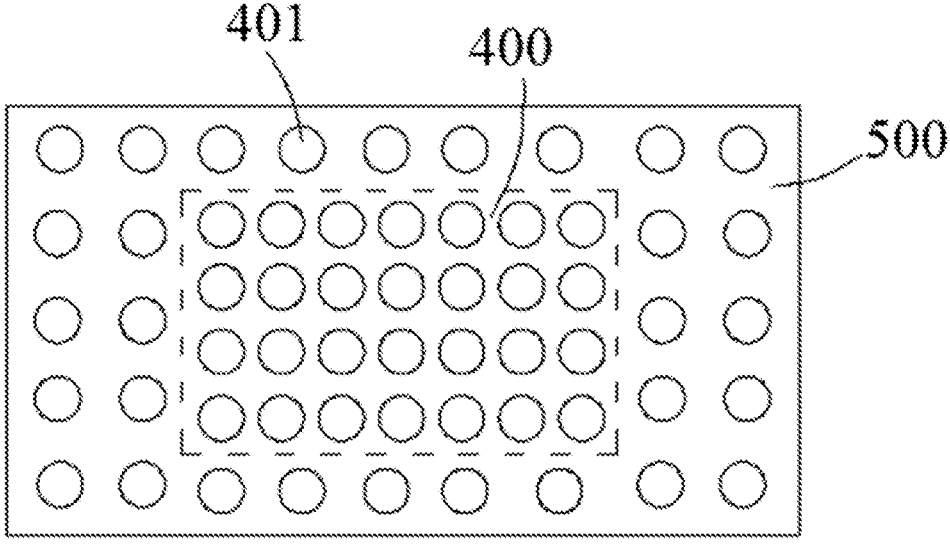
FIGS. 3 and 4 are schematic diagrams illustrating a distribution of microlenses of a display panel according to embodiments of the present disclosure.
Figure 4:
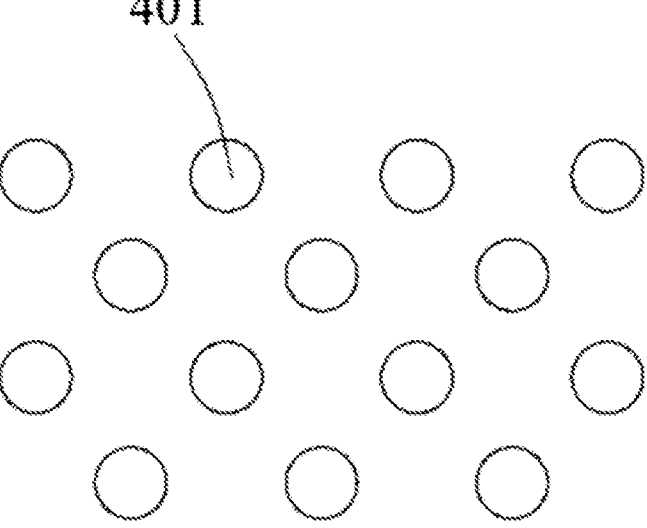

As shown in FIGS. 2 and 3, a density of the microlenses 401 in the second region 500 may be smaller than a density of the microlenses 401 in the first region 400, such that the light extraction effect of the edge region 300 of the light-emitting layer 11 can be weakened. Specifically, a distance between two adjacent microlenses 401 in the second region 500 is greater than a distance between two adjacent microlenses 401 in the first region 400, for example, as shown in FIG. 2, L3 is greater than L1, and L3 is greater than L2. Further, the density of the microlenses 401 decreases gradually from the center of the lens set 100 to the edge of the lens set 100. Specifically, as shown in FIG. 2, the distance between two adjacent microlenses 401 increases gradually from the center of the lens set 100 to the edge of the lens set 100, for example L1<L2<L3. The distance between the two adjacent microlenses 401 may be greater than the diameter of the microlens 401. In addition, the microlenses 401 of the present disclosure may be in an orthogonal distribution as shown in FIG. 3, or arranged in a honeycomb shape as shown in FIG. 4.

Figure 5:
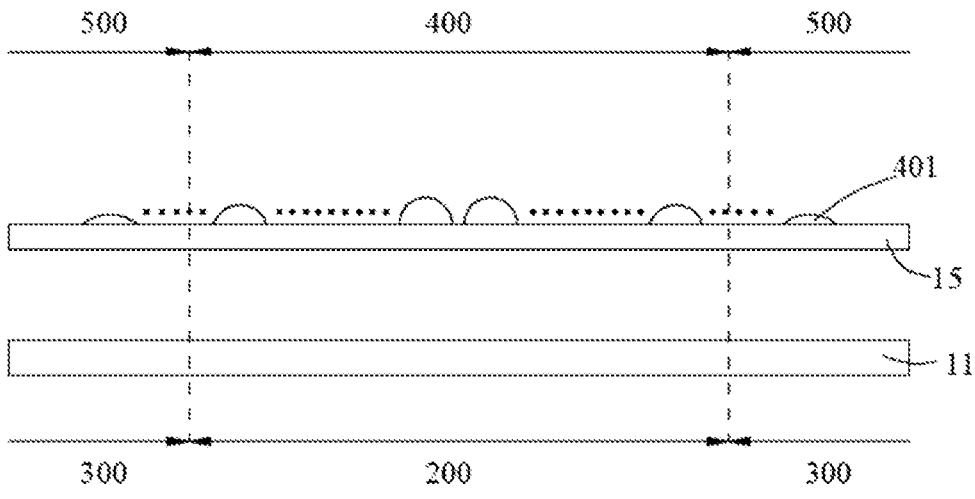
FIG. 5 is another schematic diagram illustrating a first structure layer and a light-emitting layer of a display panel according to embodiments of the present disclosure.
Figure 6:
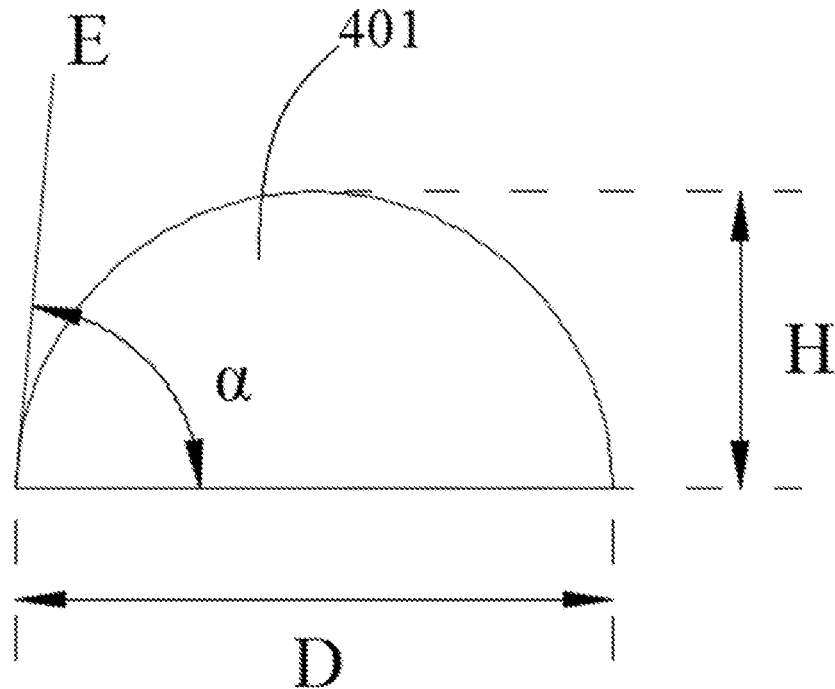
FIG. 6 is a schematic diagram illustrating a microlens of a display device according to embodiments of the present disclosure.
Figure 7:
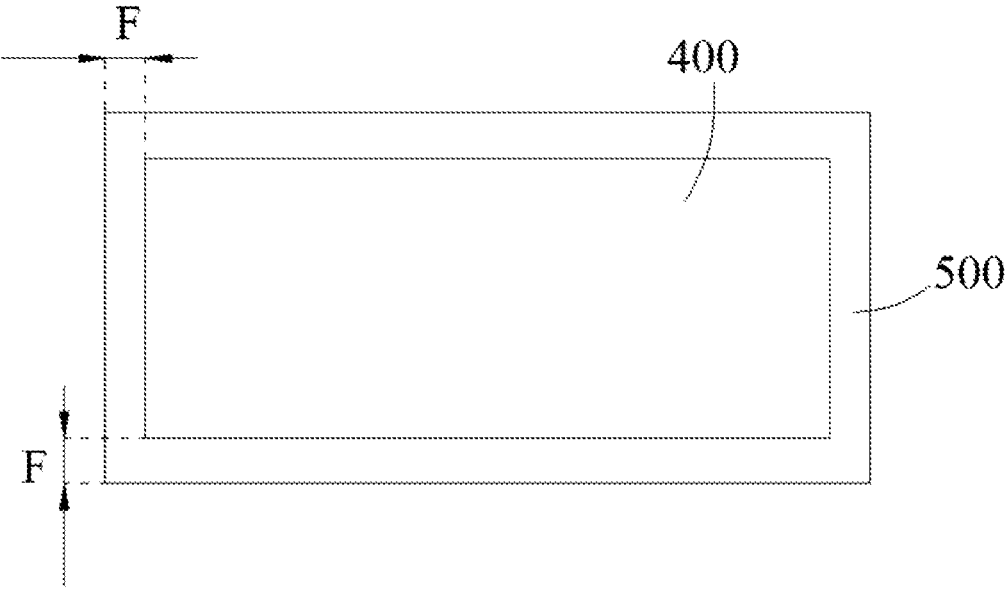
FIG. 7 is a schematic diagram illustrating an internal region and an edge region of a sub-pixel according to embodiments of the present disclosure.

As shown in FIGS. 5 and 6, taking the microlens 401 as a convex lens structure as an example, the ratio of the rise H to the diameter D of the microlens 401 in the second region 500 is smaller than the ratio of the rise to the diameter of the microlens 401 in the first region 400. The rise of the microlens 401 refers to a maximum height of the microlens 401 in a direction perpendicular to the substrate 1. The diameter of the microlens 401 refers to a diameter of an orthographic projection in a circular shape of the microlens 401 on the substrate 1. The diameters of the microlenses 401 may be the same or substantially the same, but the present disclosure is not limited thereto. The diameters of the microlenses 401 are the same or substantially the same, i.e., the diameters of the microlenses 401 are equal to a predetermined value within an error tolerance, which may be ±5%. For example, the ratio of the rise to the diameter of the microlens 401 in the second region 500 may be greater than or equal to 0.1 or less than or equal to 0.3, and further, the ratio of the rise to the diameter of the microlens 401 in the second region 500 may be greater than or equal to 0.1 and less than or equal to 0.3, such as 0.1, 0.2, 0.3, etc. The ratio of the rise to the diameter of the microlens 401 in the first region 400 can be greater than or equal to 0.4 or less than or equal to 0.7, and further, the ratio of the rise to the diameter of the microlens 401 in the first region 400 can be greater than or equal to 0.4 and less than or equal to 0.7, such as 0.4, 0.5, 0.6, 0.7, etc., such that not only the light extraction effect of the light-emitting layer 11 can be improved, but also the light leakage phenomenon at the edge of the light-emitting layer 11 can be reduced. Among them, the larger the ratio of the rise of the microlens 401 to the diameter of the microlens 401, the larger the angle α between a tangent line E at an edge point of the microlens 401 and the substrate 1 is, such that the light extraction effect can be improved. Further, the ratio of the rise to the diameter of the microlens 401 decreases gradually from the center of the lens set 100 to the edge of the lens set 100.

As shown in FIG. 1, the display panel of the embodiment of the present disclosure may further include a planarization layer 7. The planarization layer 7 may be provided on a side of the first structure layer 4 away the substrate 1 and cover the first structure layer 4. A refractive index of the planarization layer 7 may be less than the refractive index of the microlens 401. The planarization layer 7 may include a colloidal material, but the embodiment of the present disclosure is not limited thereto.

A display device is further provided in an embodiment of the present disclosure. The display device may include a display panel as described in any of the above embodiments. The display device may be a mobile phone, and certainly, may also be a tablet computer, a television, etc. Since the display panel in the display device of the embodiment of the present disclosure is the same as the touch panel in the embodiment of the above-mentioned display panel, they have the same beneficial effects, and will not be repeated here.

The above are only preferred embodiments of the present disclosure, and they do not limit the present disclosure in any form. Although the present disclosure has been disclosed in the preferred embodiments, they are not used to limit the present disclosure. Those skilled in the art can make some changes or modifies into an equivalent embodiment by using the technical content disclosed above without departing from the scope of the technical solution of the present disclosure. So long as the content does not depart from the technical solution of the present disclosure, any simple changes, equivalent changes or modifications made to the above embodiments according to the technical essence of the present disclosure shall all belong to the scope of the technical solution of the present disclosure.

The invention claimed is:

1. A display panel, comprising:
 a substrate;
 sub-pixels, on a side of the substrate, the sub-pixels comprising light-emitting layers respectively, and for at least one of the light-emitting layers, each of the at least one of the light-emitting layers comprising an internal region and an edge region surrounding the internal region; and
 a first structure layer, on a light-emitting side of the light-emitting layers and comprising lens sets, one of the lens sets comprising microlenses, the lens sets corresponding to the sub-pixels one by one, and the one of the lens sets comprising a first region corresponding to the internal region and a second region corresponding to the edge region, wherein a density of microlenses in the second region is smaller than a density of microlenses in the first region;

wherein each of the microlenses is a convex lens structure, a ratio of a rise of one of the microlenses in the second region to a diameter of the one of the microlenses in the second region is smaller than a ratio of a rise of another of the microlenses in the first region to a diameter of the another of the microlenses in the first region.

2. The display panel according to claim 1, wherein from a center of the one of the lens sets to an edge of the one of the lens sets, a density of the microlenses decreases gradually.

3. The display panel according to claim 1, wherein a distance between two adjacent microlenses in the second region is greater than a distance between two adjacent microlenses in the first region.

4. The display panel according to claim 3, wherein from a center of the one of lens sets to an edge of the one of lens sets, a distance between two adjacent microlenses increases gradually.

5. The display panel according to claim 3, wherein a distance between two adjacent microlenses is less than a diameter of each of the two adjacent microlenses.

6. The display panel according to claim 5, wherein a diameter of one of the microlenses in the second region is the same as a diameter of another of the microlenses in the first region.

7. The display panel according to claim 5, wherein from a center of the one of the lens sets to an edge of the one of the lens sets, a ratio of a rise of one of the microlenses to a diameter of the one of the microlenses decreases gradually.

8. The display panel according to claim 1, wherein the ratio of the rise of the one of the microlenses in the second region to the diameter of the one of the microlenses in the second region is greater than or equal to 0.1 or less than or equal to 0.3.

9. The display panel according to claim 1, wherein the ratio of the another of the microlenses in the first region the rise to the diameter of the another of the microlenses in the first region is greater than or equal to 0.4 or less than or equal to 0.7.

10. The display panel according to claim 1, wherein a width of the edge region is greater than or equal to 5 μm or less than or equal to 10 μm.

11. The display panel according to claim 1, further comprising:
 an encapsulation structure, covering the sub-pixels, wherein the first structure layer is on a side of the encapsulation structure away the substrate.

12. The display panel according to claim 11, wherein the encapsulation structure comprises:
 a first inorganic encapsulation layer, covering the sub-pixels;
 an organic encapsulation layer, on the first inorganic encapsulation layer; and
 a second inorganic encapsulation layer, covering the organic encapsulation layer, wherein the microlenses are on a surface of the second inorganic encapsulation layer away the substrate, and a refractive index of each of the microlenses is same as a refractive index of the second inorganic encapsulation layer.

13. The display panel according to claim 1, further comprising:
 a planarization layer, covering the first structure layer, and a refractive index of the planarization layer is less than a refractive index of each of the microlenses.

14. A display device, comprising:
the display panel according to claim 1.

\*  \*  \*  \*  \*